United States Patent
Hino (10) Patent No.: US 7,935,946 B2
(45) Date of Patent: May 3, 2011

(54) ION IMPLANTATION METHOD AND APPARATUS

(75) Inventor: Masayoshi Hino, Kyoto (JP)

(73) Assignee: Nissin Ion Equipment Co., Ltd., Kyoto (JP)

( * ) Notice: Subject to any disclaimer, the term of this patent is extended or adjusted under 35 U.S.C. 154(b) by 282 days.

(21) Appl. No.: 12/369,307

(22) Filed: Feb. 11, 2009

(65) Prior Publication Data

US 2009/0200492 A1   Aug. 13, 2009

(30) Foreign Application Priority Data

Feb. 12, 2008   (JP) .................. 2008-030750

(51) Int. Cl.
*A61N 5/00* (2006.01)
*G21G 5/00* (2006.01)
(52) U.S. Cl. .............. 250/492.3; 250/492.1; 250/492.2; 250/492.21; 250/492.22; 250/397; 250/398; 438/7; 438/522; 438/525; 438/535; 430/30
(58) Field of Classification Search ........... 250/492.3, 250/492.1, 492.2, 492.22, 492.21, 397, 398; 438/7, 525, 522, 535; 430/30
See application file for complete search history.

(56) References Cited

U.S. PATENT DOCUMENTS

| 2004/0058513 A1* | 3/2004 | Murrell et al. ............... 438/535 |
| 2005/0184254 A1* | 8/2005 | Matsumoto et al. ....... 250/492.21 |
| 2009/0200491 A1* | 8/2009 | Hino ........................... 250/492.3 |

FOREIGN PATENT DOCUMENTS

| JP | 3-114128 | 5/1991 |
| JP | 3341749 | 8/2002 |
| JP | 2004-95434 | 3/2004 |
| JP | 3692999 | 7/2005 |

OTHER PUBLICATIONS

Patent Abstracts of Japan for Japanese Publication No. 2001-185071, Publication date Jul. 6, 2001 (1 page) (Corresponds to JP3341749).
Patent Abstracts of Japan for Japanese Publication No. 2004-095434, Publication date Mar. 25, 2004 (1 page).
Patent Abstracts of Japan for Japanese Publication No. 03-114128, Publication date May 15, 1991 (1 page).
Patent Abstracts of Japan for Japanese Publication No. 2003-132835, Publication date May 9, 2003 (1 page) (Corresponds to JP3692999).

* cited by examiner

*Primary Examiner* — Bernard E Souw
*Assistant Examiner* — Meenakshi S Sahu
(74) *Attorney, Agent, or Firm* — Osha Liang LLP (57) ABSTRACT

Using a beam current of an ion beam, a dose amount to a substrate, and a reference scan speed, a scan number of the substrate is calculated as an integer value in which digits after a decimal point are truncated. If the scan number is smaller than 2, the process is aborted. If the scan number is equal to or larger than 2, it is determined whether the scan number is even or odd. If the scan number is even, the current scan number is set as a practical scan number. If the scan number is odd, an even scan number which is smaller by 1 than the odd scan number is obtained, and the obtained even scan number is set as a practical scan number. A practical scan speed of the substrate is calculated by using the practical scan number, the beam current, and the dose amount.

4 Claims, 9 Drawing Sheets

ION IMPLANTATION METHOD AND APPARATUS

TECHNICAL FIELD

The present disclosure relates to an ion implantation method and apparatus for implanting ions into a substrate using both a ribbon-like (this is called also a sheet-like or a strip-like) ion beam in which, with or without performing an X-direction sweep, a dimension in an X direction is larger than a dimension in a Y direction that is orthogonal to the X direction, and a mechanical scan of the substrate in a direction intersecting with the principal face of the ion beam. In the specification, in order to be easily distinguished from a sweep of an ion beam, an operation of mechanically sweeping a substrate is referred to as a scan.

RELATED ART

Figure 6:
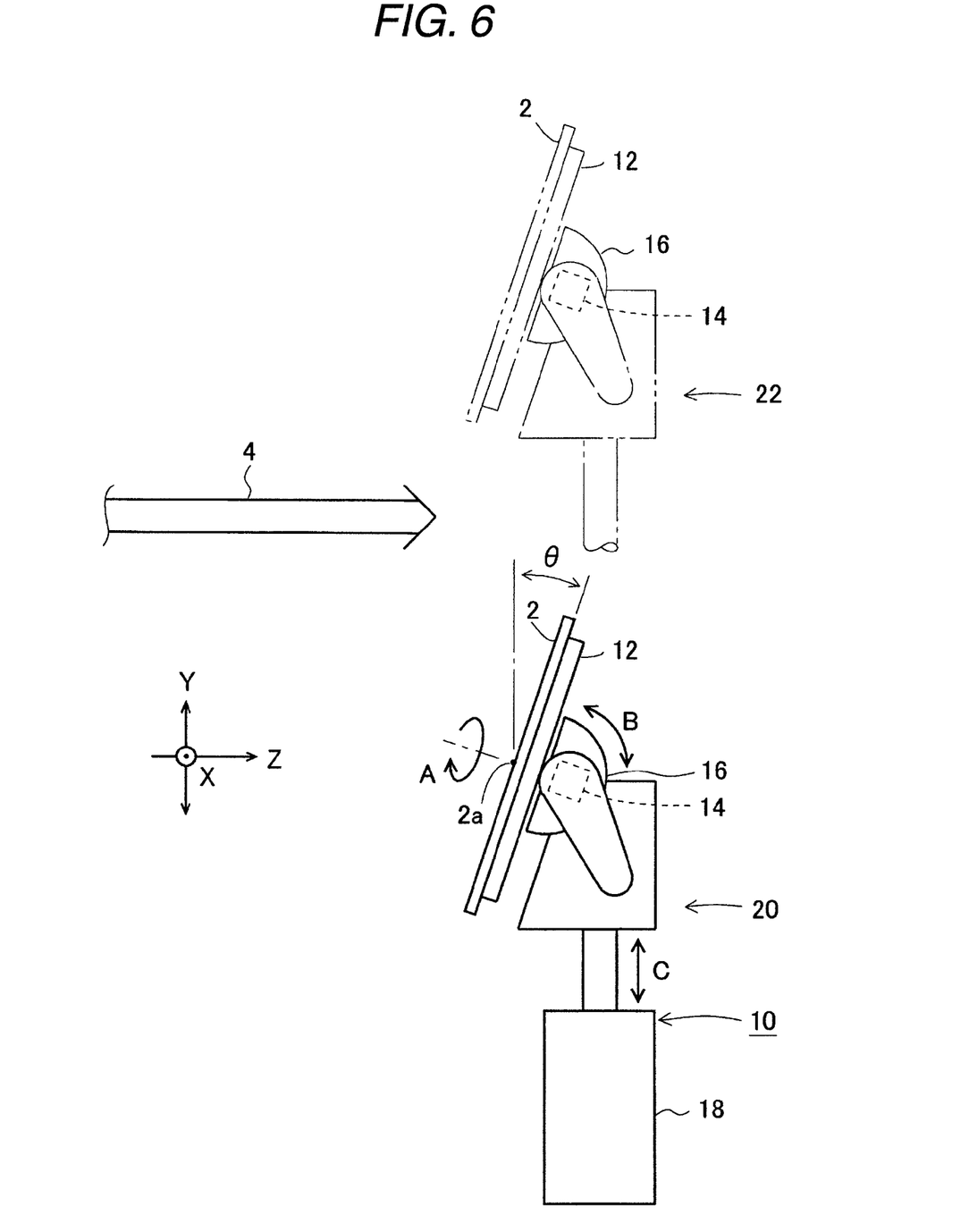
FIG. 6 is a side view showing an example of an ion implantation apparatus for implementing a related-art ion implantation method.

FIG. 6 shows a related-art example of an ion implantation apparatus of this kind. The ion implantation apparatus has a configuration which implants ions into (for example, a whole face of) a substrate (for example, a semiconductor substrate) 2 using both a ribbon-like ion beam 4 and an operation of mechanically scanning the substrate 2 in a direction intersecting with the principal face 4b (see FIG. 8) of the ion beam 4, by a substrate driving device 10.

Figure 8:
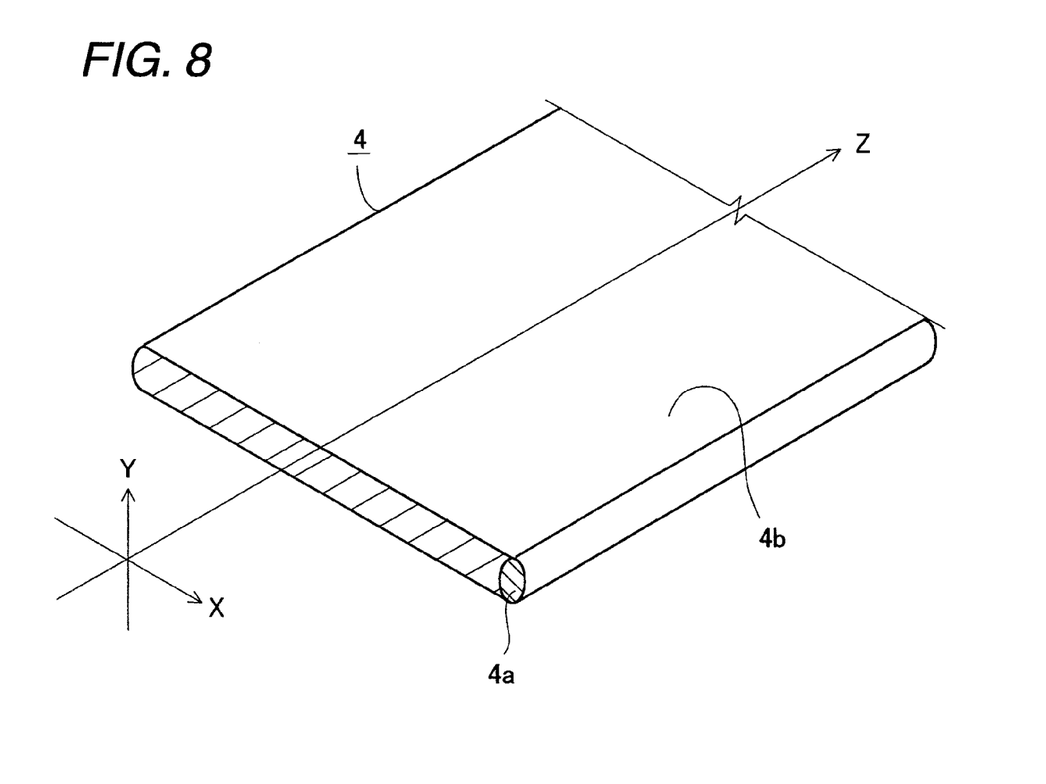
FIG. 8 is a perspective view partly showing an example of a ribbon-like ion beam.

Referring to FIG. 8, for example, the ion beam 4 undergoes a sweep process in the X direction (for example, a horizontal direction) which is based on an electric or magnetic field produced by a beam sweeper (not shown), and has a ribbon-like section shape in which the dimension in the X direction is larger than that in the Y direction (for example, a vertical direction) that is orthogonal to the X direction. For example, the ion beam 4 before the sweep operation has a section shape such as a small oval or circle as indicated by the reference numeral 4a in FIG. 8. Alternatively, without undergoing such sweep a process in the X direction, the ion beam 4 (for example, the ion beam itself derived from an ion source) may have a ribbon-like section shape in which the dimension in the X direction is larger than that in the Y direction.

In this example, the substrate driving device 10 has: a holder 12 which holds the substrate 2; a motor 14 which rotates the holder 12 together with the substrate 2 about a center portion 2a of the substrate 2 as indicated by the arrow A (or in the opposite direction) (this motor is referred to as the twist motor in order to be distinguished from a motor 16 which will be described later); and the motor 16 which drives (reciprocally swings) the holder 12 together with the substrate 2 and the twist motor 14 as indicated by the arrow B to change the inclination angle θ of the holder 12 and the substrate 2 (this motor is referred to as the tilt motor in order to be distinguished from the twist motor 14). For example, the inclination angle θ can be changed in a range from 0 deg. (i.e., the state where the holder 12 is vertical) to the vertical to 90 deg. (i.e., the state where the holder 12 is horizontal).

The substrate driving device 10 further has a scanning device 18 which mechanically scans the holder 12, the substrate 2, and the like so as to reciprocate between one end (for example, the lower end) 20 of the scan and the other end (for example, the upper end) 22 as indicated by the arrow C, thereby mechanically scanning the substrate 2 in a direction (for example, the Y direction) intersecting with the principal face 4b of the ion beam 4. The scan direction of the substrate 2 is not restricted to the direction of the arrow C (the Y direction). In some cases, the scan may be performed in parallel with the surface of the substrate 2. In the specification, one scan of the substrate 2 means a one-way scan.

A substrate driving device having a configuration which is substantially identical with that of the substrate driving device 10 is disclosed in Patent Reference 1.

Figure 7:
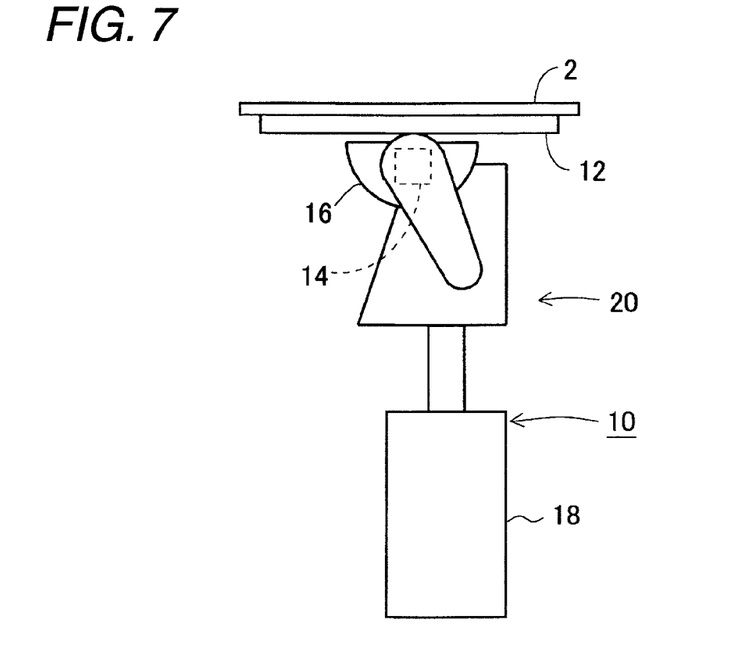
FIG. 7 is a view showing an example of a state of a substrate driving device in replacement of a substrate.

As shown in FIG. 7, for example, replacement of the substrate 2 with respect to the holder 12 (for example, that of an ion-implanted substrate 2 with a substrate 2 before the ion implantation) is performed while the holder 12 is set to a substantially horizontal state at the one end 20 of the scan.

In the ion implantation into the substrate 2, in accordance with Expression 1 or an expression which is mathematically equivalent thereto, for example, the scan number of the substrate 2 is calculated by using the beam current of the ion beam 4, the dose amount to the substrate 2, and a reference scan speed which is used as a reference for calculating the scan number of the substrate 2. Usually, the calculated scan number is a mixed decimal with number of digits after the decimal point. Therefore, a scan number in which the digits after the decimal point are truncated, or which is an integer is calculated, and the calculated number is set as a scan number which is practically used. In the case where the calculated scan number is 3.472, for example, 3 is set as the scan number which is practically used. In accordance with Expression 2 or an expression which is mathematically equivalent thereto, for example, the scan speed which is practically used is calculated by the scan number which is practically used. In related-art, the ion implantation is performed on the substrate 2 in accordance with the scan number and scan speed which are calculated in this manner.

$$\text{scan number [time]} = \frac{\text{dose amount [ions/cm}^2\text{]} \times \text{reference scan speed [cm/sec]} \times \text{elementary electric charge } [C] \times \text{coefficient}}{\text{beam current} \times 10^{-6} [C/\text{sec}]} \quad \text{[Expression 1]}$$

$$\text{scan speed [cm/sec]} = \frac{\text{beam current} \times 10^{-6} [C/\text{sec}] \times \text{scan number}}{\text{dose amount [ions/cm}^2\text{]} \times \text{elementary electric charge } [C] \times \text{coefficient}} \quad \text{[Expression 2]}$$

In Expressions 1 and 2 described above, the elementary electric charge is $1.602 \times 10^{-19}$ [C], and the coefficient is a coefficient which is specific to the ion implantation apparatus. This is applicable also to Expression 4 and Expression 5 which will be described later.

Figure 9:
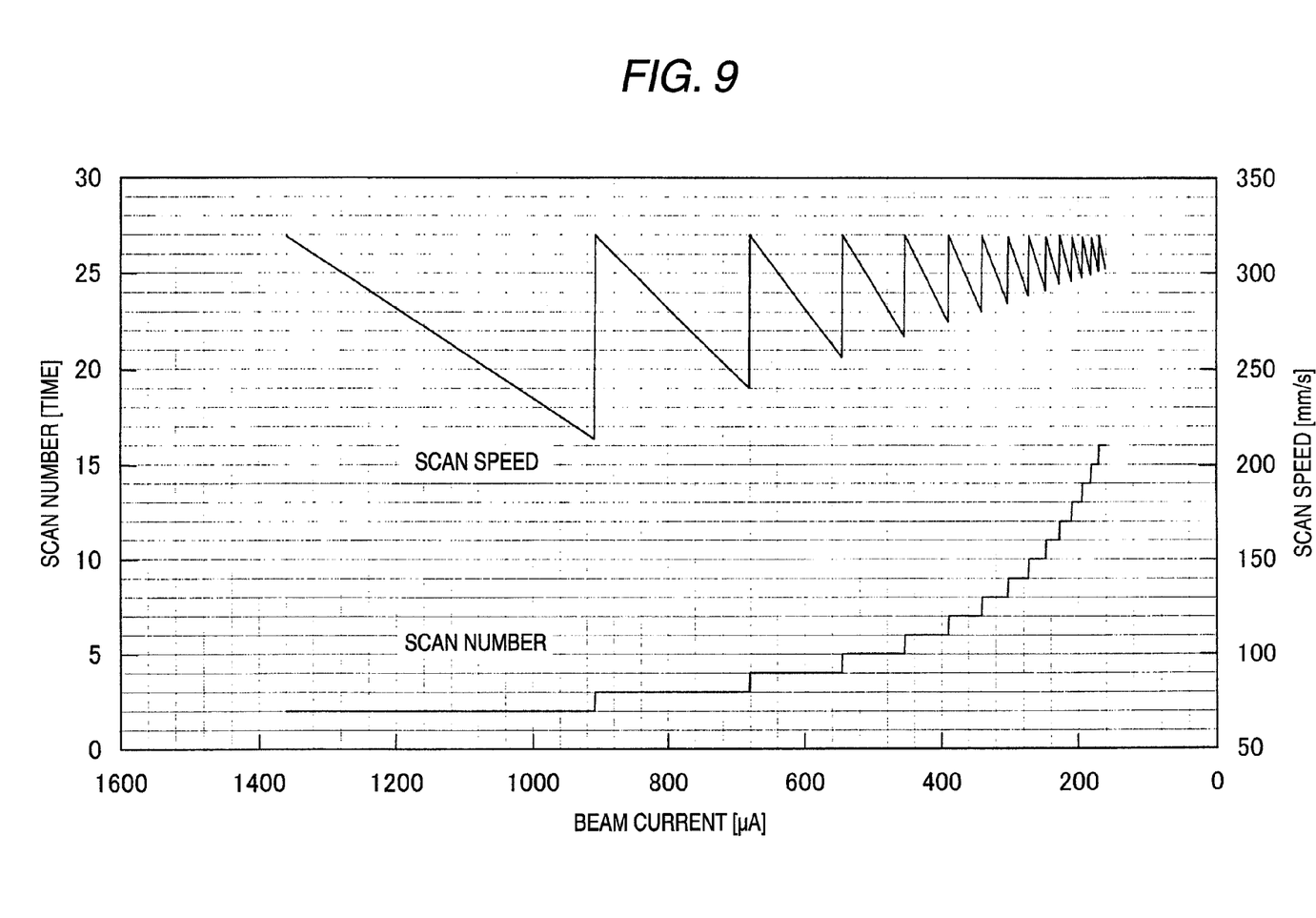
FIG. 9 is a view showing an example of the scan number and scan speed of the substrate in the case where the related-art ion implantation method is employed.

FIG. 9 shows an example of the scan number and scan speed of the substrate 2 in the case where the related-art ion implantation method (apparatus) is employed. FIG. 9 is a graph showing transitions of the scan number and the scan speed in the case where the dose amount is fixed and the beam current is reduced. The reference scan speed was 320 mm/sec. In order to make the dose amount constant, the scan number is increased in accordance with reduction of the beam current. Also in the case where the beam current is fixed and the dose amount is increased, a similar tendency is obtained.

As seen also in FIG. 9, the scan number is even or odd depending on the implantation conditions including the beam current and the dose amount. The phenomenon that the scan number is even or odd is described also in, for example, Patent Reference 2.

[Patent Reference 1] JP-A-2004-95434 (Paragraphs [0010] to [0017], FIG. 6)

[Patent Reference 2] Japanese Patent No. 3,341,749 (Table 2, FIG. 3)

In the related-art ion implantation method (apparatus), in the case where the scan number of the substrate 2 is odd, the substrate 2, the holder 12, and the like at the end of the ion implantation into the substrate 2 are located in the other end 22 of the scan as indicated by the dash-dot-dot line in FIG. 6. As described above, the position of replacement of the substrate 2 with respect to the holder 12 is in the end 20 of the scan (see FIGS. 6 and 7). After the ion implantation, therefore, the substrate 2, the holder 12, and the like must be moved (in this example, lowered) by a distance corresponding to the one scan. The moving time for the one scan is extra and becomes a time loss. For example, the time loss per substrate is about 1 to 1.6 sec. The time loss causes the throughput of the ion implantation to be lowered.

SUMMARY

Exemplary embodiments of the present invention provide an ion implantation method and apparatus in which the scan number of a substrate is prevented from being odd-numbered, to eliminate a time loss in the case where the scan number is odd, so that the throughput is improved.

An ion implantation method according to a first aspect of the invention is characterized in that the method comprises:

calculating a scan number of the substrate as an integer value in which digits after a decimal point are truncated by using a beam current of the ion beam, a dose amount to the substrate, and a reference scan speed which is used as a reference for calculating a scan number of the substrate;

determining whether the calculated scan number is 2 or more or not; if the scan number is smaller than 2, aborting a process of obtaining a practical scan number and a practical scan speed; if the scan number is equal to or larger than 2, determining whether the calculated scan number is even or odd; if the scan number is even, setting the current scan number as the practical scan number; and, if the scan number is odd, obtaining an even scan number which is smaller by 1 than the odd scan number, and setting the obtained even scan number as the practical scan number;

calculating the practical scan speed of the substrate by using the practical scan number, the beam current, and the dose amount; and performing ion implantation on the substrate in accordance with the practical scan number and the practical scan speed.

An ion implantation apparatus according to a second aspect of the invention is characterized in that the apparatus comprises:

a controlling device having functions of: (a) calculating a scan number of the substrate, as an integer value in which digits after a decimal point are truncated by using a beam current of the ion beam, a dose amount to the substrate, and a reference scan speed which is used as a reference for calculating a scan number of the substrate; (b) determining whether the calculated scan number is 2 or more or not; if the scan number is smaller than 2, aborting a process of obtaining a practical scan number and a practical scan speed; if the scan number is equal to or larger than 2, determining whether the calculated scan number is even or odd; if the scan number is even, setting the current scan number as the practical scan number; and, if the scan number is odd, obtaining an even scan number which is smaller by 1 than the odd scan number, and setting the obtained even scan number as the practical scan number; (c) calculating the practical scan speed of the substrate by using the practical scan number, the beam current, and the dose amount; and (d) performing ion implantation on the substrate in accordance with the practical scan number and the practical scan speed.

In the ion implantation method or apparatus, the scan number of the substrate is prevented from being odd-numbered, and the practical scan number of the substrate can be surely even-numbered.

An ion implantation method according to a third aspect of the invention is a method of implanting ions into a substrate using both a ribbon-like ion beam in which, with or without performing an X direction sweep, a dimension in an X direction is larger than a dimension in a Y direction that is orthogonal to the X direction, a mechanical scan of the substrate in a direction intersecting with a principal face of the ion beam, and performance of ion implantation while, during a period when the ion beam does not impinge on the substrate, rotating the substrate by a step of 360/m deg. about a center portion of the substrate, and dividing one rotation of the substrate into a plurality m of implanting steps, the method comprising:

calculating a scan number per implanting step of the substrate as an integer value in which digits after a decimal point are truncated by using a beam current of the ion beam, a dose amount to the substrate, a implanting step number, and a reference scan speed which is used as a reference for calculating a scan number per implanting step of the substrate;

determining whether the calculated scan number per implanting step is 1 or more or not; if the scan number is smaller than 1, aborting a process of obtaining a practical scan number per implanting step and a practical scan speed; if the scan number is equal to or larger than 1, determining whether the calculated scan number per implanting step is even or odd; if the scan number is even, setting the current scan number as the practical scan number per implanting step; if the scan number is odd, determining whether the scan number is 1 or not; if the scan number is 1, setting the current scan number as a practical scan number per implanting step; and, if the scan number is not 1, obtaining an even scan number which is smaller by 1 than the odd scan number, and setting the obtained even scan number is set as the practical scan number per implanting step;

calculating the practical scan speed of the substrate by using the practical scan number per implanting step, the beam current, the dose amount, and the implanting step number; and performing ion implantation on the substrate in accordance with the practical scan number per implanting step and the practical scan speed.

An ion implantation apparatus according to a fourth aspect of the invention is an apparatus for implanting ions into a substrate using both a ribbon-like ion beam in which, with or without performing an X direction sweep, a dimension in an X direction is larger than a dimension in a Y direction that is orthogonal to the X direction, a mechanical scan of the substrate in a direction intersecting with a principal face of the ion beam, and performance of ion implantation while, during a period when the ion beam does not impinge on the substrate, rotating the substrate by a step of 360/m deg. about a center portion of the substrate, and dividing one rotation of the substrate into a plurality m of implanting steps, the apparatus comprising:

a controlling device having functions of: (a) calculating a scan number per implanting step of the substrate, as an integer value in which digits after a decimal point are truncated by using a beam current of the ion beam, a dose amount to the substrate, a number of the implanting steps, and a reference scan speed which is used as a reference for calculating a scan number per implanting step of the substrate; (b) determining whether the calculated scan number per implanting step is 1 or more or not; if the scan number is smaller than 1, aborting a process of obtaining a practical scan number per implanting step and a practical scan speed; if the scan number is equal to or larger than 1, determining whether the calculated scan number per implanting step is even or odd; if the scan number is even, setting the current scan number, as the practical scan number per implanting step; if the scan number is odd, determining whether the scan number is 1 or not; if the scan number is 1, setting the current scan number, as the practical scan number per implanting step; and, if the scan number is not 1, obtaining an even scan number which is smaller by 1 than the odd scan number, and setting the obtained even scan number as the practical scan number per implanting step; (c) calculating a practical scan speed of the substrate by using the practical scan number per implanting step, the beam current, the dose amount, and the implanting step number; and (d) performing ion implantation on the substrate in accordance with the practical scan number per implanting step and the practical scan speed.

In the ion implantation method or apparatus, in the case other than a combination of the case where the practical scan number per implanting step is 1 and that where the implanting step number is odd, the total scan number of the substrate can be even-numbered, and therefore it is possible to prevent the scan number from being odd-numbered.

According to the inventions set forth in the first and second aspects, the scan number of the substrate is prevented from being odd-numbered, and the practical scan number of the substrate can be surely even-numbered. As a result, a time loss due to the moving time for one extra scan in the case where the scan number is odd can be eliminated, and the throughput can be improved.

In the case where the calculated scan number is odd, an even practical scan number is obtained by a decrement of 1 in place of an increment of 1, and therefore the scan number is reduced by one. As a result, the time loss which mainly consists of deceleration and acceleration times of the substrate in the vicinities of scan ends for the scan return can be reduced by a time corresponding to one scan. Also from this viewpoint, therefore, the throughput can be improved.

According to the inventions set forth in the third and fourth aspects, in the case other than a combination of the case where the practical scan number per implanting step is 1 and that where the implanting step number is odd, the total scan number of the substrate can be even-numbered, and therefore it is possible to prevent the scan number from being odd-numbered. As a result, a time loss due to the moving time of one extra scan in the case where the scan number is odd can be eliminated, and the throughput can be improved.

In the case where the calculated scan number per implanting step is an odd number other than 1, an even practical scan number is obtained by a decrement of 1 in place of an increment of 1, and therefore the scan number per implanting step is reduced by one. As a result, the time loss which mainly consists of deceleration and acceleration times of the substrate in the vicinities of scan ends for the scan return can be reduced per implanting step by a time corresponding to one scan. Also from this viewpoint, therefore, the throughput can be improved.

Other features and advantages may be apparent from the following detailed description, the accompanying drawings and the claims.

DETAILED DESCRIPTION

Figure 1:
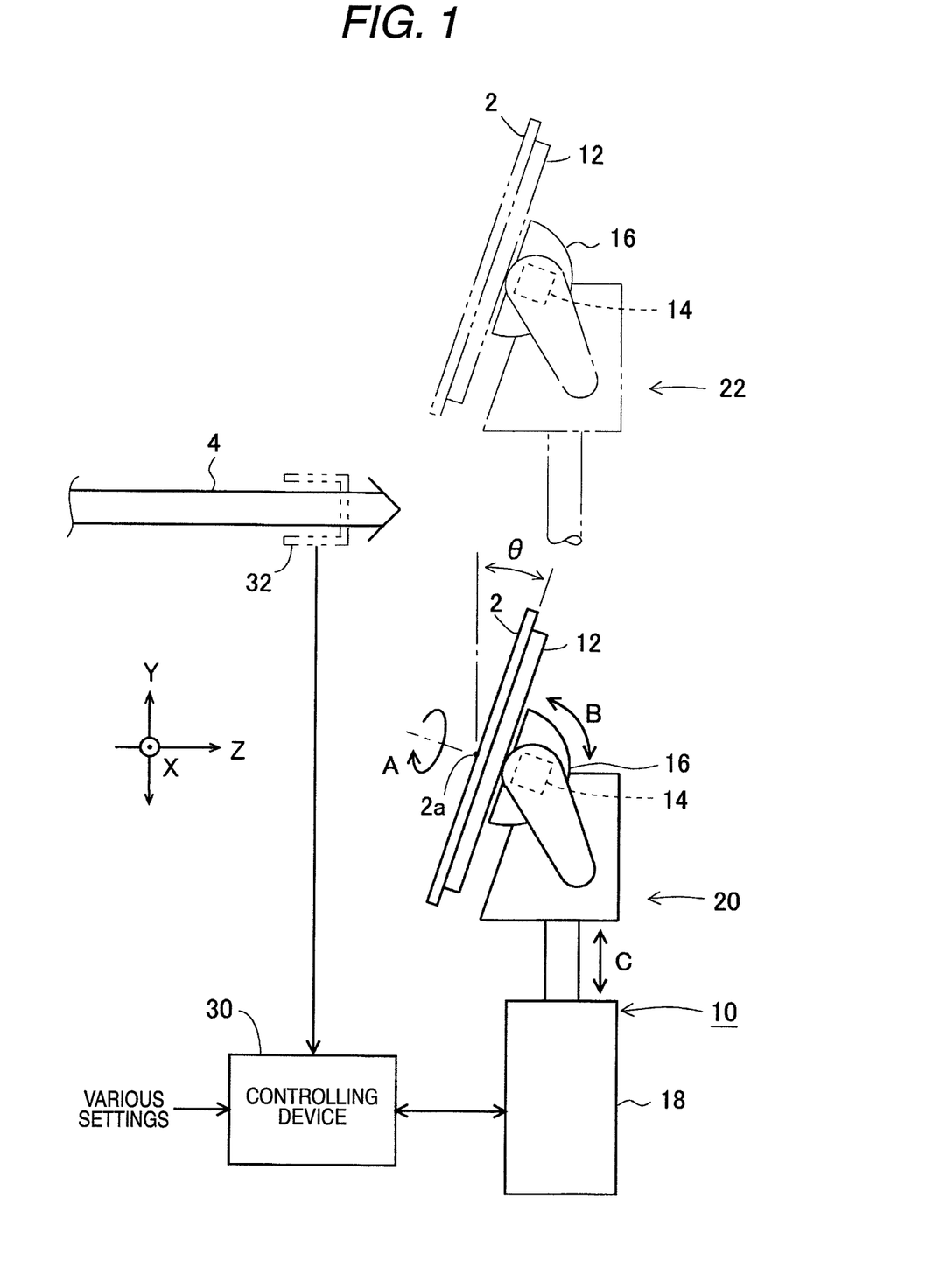
FIG. 1 is a side view showing an embodiment of an ion implantation apparatus for implementing the ion implantation method of the invention.

FIG. 1 is a side view showing an embodiment of an ion implantation apparatus for implementing the ion implantation method of the invention. The portions which are identical or corresponding to those of the related-art example shown in FIGS. 6 to 8 are denoted by the same reference numerals, and, in the following description, emphasis is placed on differences from the related-art example.

The ion implantation apparatus includes, in addition to the configuration of the above-described related-art ion implantation apparatus, a controlling device 30 having a function of performing a calculation control which will be described later, and a beam current measuring device 32 which measures the beam current of the ion beam 4.

The beam current of the ion beam 4, the dose amount to the substrate 2, and a reference scan speed which is used as a reference for calculating the scan number of the substrate 2 are given to the controlling device 30. In the embodiment, more specifically, a measurement value which is measured by the beam current measuring device 32 is given as the beam current of the ion beam 4. The dose amount and the reference scan speed are given as preset values.

The beam current measuring device 32 is, for example, a Faraday cup, and receives the ion beam 4 which is conducting the ion implantation into the substrate 2, at a position where the device does not interfere with the ion implantation into the substrate 2 (for example, in the vicinity of one end in the X direction of the ribbon-like ion beam 4), and measures the beam current of the ion beam.

The controlling device 30 has a function of controlling the substrate driving device 10, specifically, the scanning device 18, twist motor 14, and tilt motor 16 which constitute the substrate driving device. More specifically, the controlling device 30 performs the calculation control which will be described below, to implement an ion implantation method which will be described below. An example will be described with reference to FIG. 2.

Figure 2:
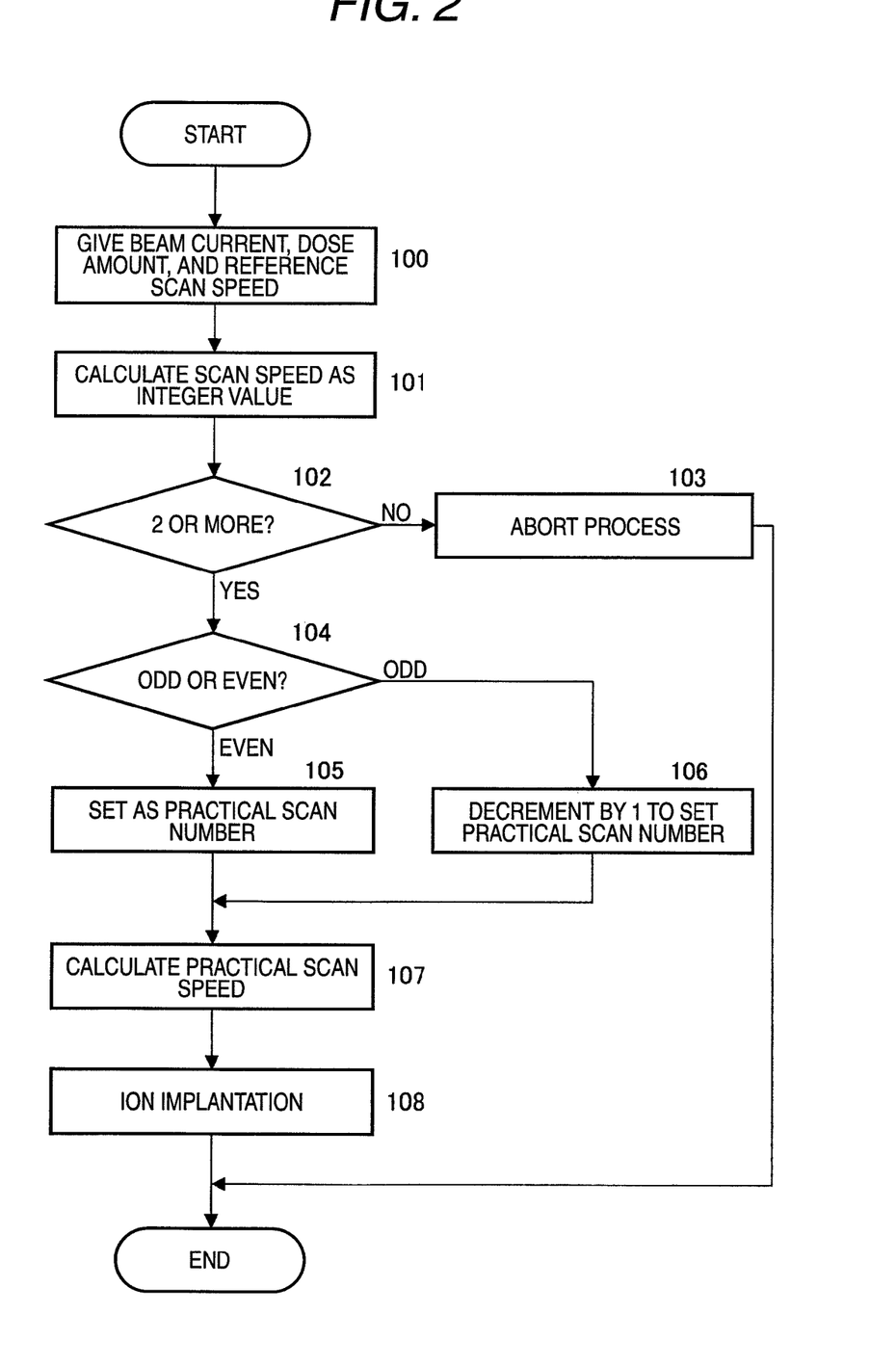
FIG. 2 is a flowchart showing an embodiment of the ion implantation method of the invention.

As described above, the beam current of the ion beam 4, the dose amount to the substrate 2, and the reference scan speed are given to the controlling device 30 (step 100). The number of scans of the substrate 2 which are performed for realizing the dose amount by the substrate driving device 10 (more specifically, the scanning device 18) is calculated by using these values, as an integer value in which digits after a decimal point are truncated (step 101). In accordance with Expression 1 described above or an expression which is mathematically equivalent thereto, more specifically, the scan number of the substrate 2 is calculated. In the case where the calculated scan number is a mixed decimal with number of digits after the decimal point, the digits after the decimal point are truncated, or a scan number which is an integer is calculated. In the case where the calculated scan number is 3.472, for example, 3 is set as the scan number.

Next, it is determined whether the scan number which is calculated as an integer value is 2 or more or not (step 102). If the scan number is smaller than 2, the process of obtaining a practical scan number and a practical scan speed is aborted (step 103) because the scan number cannot be even-numbered. In this case, for example, the implantation conditions (the beam current and the dose amount) and the reference scan speed are changed, and the process is again performed with starting from step 100. If the scan number is 2 or more, it is determined whether the scan number is even or not (step 104). If the scan number is even, the current scan number is set as a practical scan number (namely, which is to be practically used, the same shall apply hereinafter) (step 105). If the scan number is odd, an even scan number which is smaller by 1 than the odd scan number is obtained, and the obtained even scan number is set as a practical scan number (step 106). In the case where the scan number calculated as an integer value is 3, the scan number is decremented by 1, and 2 is set as the practical scan number.

In accordance with Expression 2 described above or an expression which is mathematically equivalent thereto, for example, the practical scan speed of the substrate 2 by the substrate driving device 10 (more specifically, the scanning device 18) is calculated by using the practical scan number, the beam current, and the dose amount (step 107). The practical scan speed is lower than the reference scan speed because the scan number is made integer and even-numbered as described above.

Then, ion implantation is performed on the substrate 2 in accordance with the practical scan number and the practical scan speed (step 108).

Figure 3:
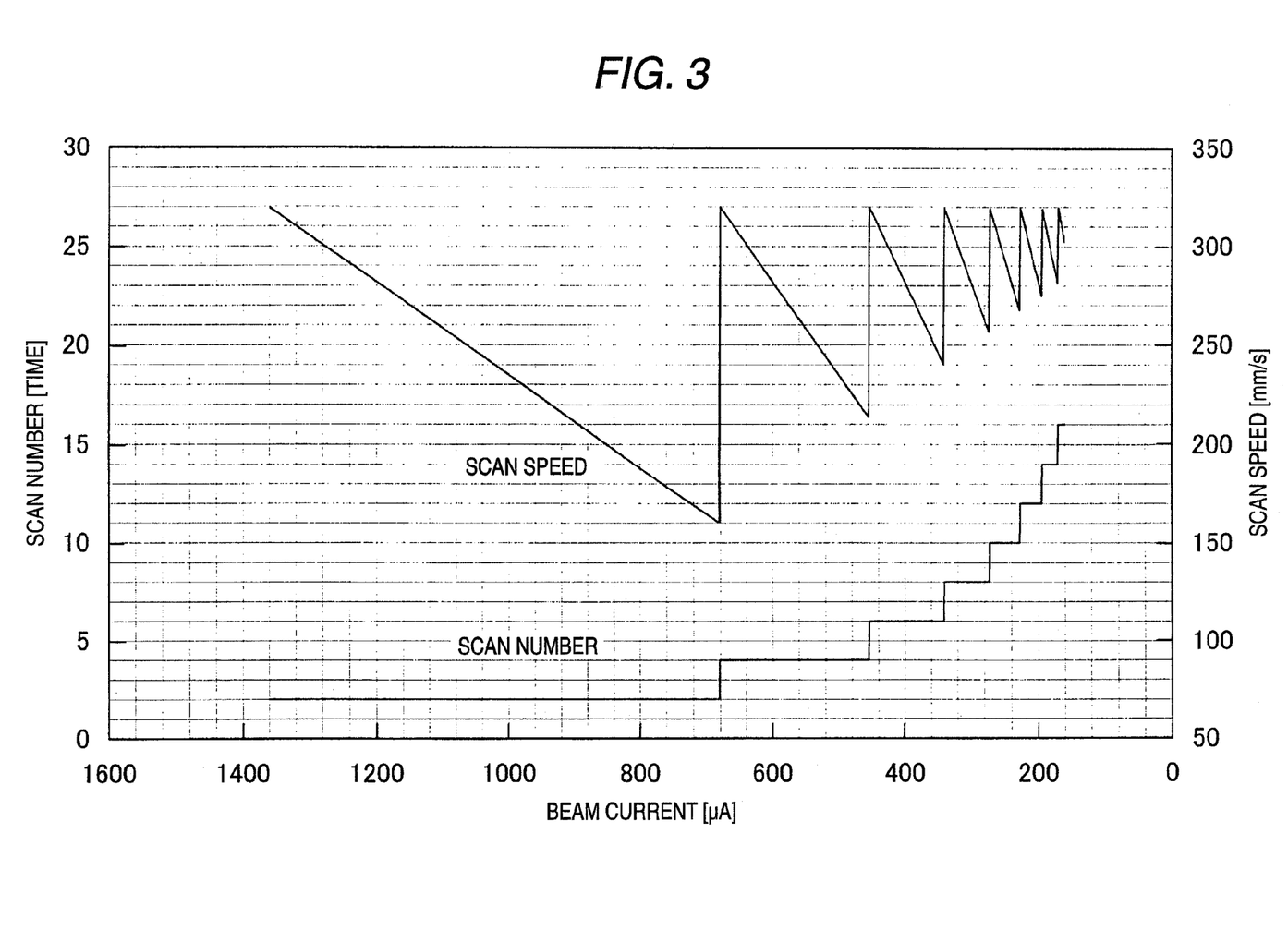
FIG. 3 is a view showing an example of a scan number and scan speed of a substrate in the case where the ion implantation method of the invention is employed.

FIG. 3 shows an example of the practical scan number and practical scan speed of the substrate 2 in the case where the ion implantation method (apparatus) of the embodiment is employed. The figure is a graph which, in a similar manner as FIG. 9, shows transitions of the practical scan number and the practical scan speed in the case where the dose amount is fixed and the beam current is reduced. The dose amount and the reference scan speed are equal to those in the case of FIG. 9. In accordance with reduction of the beam current, the scan number is increased. However, it is seen that the scan number is always even. Also in the case where the beam current is fixed and the dose amount is increased, a similar tendency is observed, and the scan number is increased while maintained to be even.

Preferably, the beam current of the ion beam 4 is not a preset value but a value measured by the beam current measuring device 32 as in the embodiment. According to the configuration, even when the beam current fluctuates during ion implantation into the single substrate 2, a control of changing the scan speed in direct proportion to the beam current can be performed, so that uniform ion implantation in the Y direction can be realized without being affected by the fluctuation of the beam current. The control in which the scan speed is in direct proportion to the beam current as described above is disclosed also in, for example, JP-A-3-114128 (see the upper left column of page 2) and Japanese Patent No. 3,692,999 (see Paragraph [0037]).

In the ion implantation in step 108, there are two cases: (a) the ion implantation into the single substrate 2 is always performed at the scan speed; and (b) the ion implantation is performed with using also a control in which, while using the practical scan speed as a reference, the scan speed is in direct proportion to the beam current as described above during ion implantation into the single substrate 2. The term "in accordance with the practical scan speed" in step 108 described above is used in the meaning that both the cases (a) and (b) are included. This is applicable also to ion implantation (steps 119) in other embodiments which will be described later.

In the embodiment, the controlling device 30 has a function of performing the calculation control which has been described with reference to FIG. 2, and a further function of performing a control in which the scan speed is in direct proportion to the beam current as described above during ion implantation into the substrate 2.

In the ion implantation method (apparatus) of the embodiment, the scan number of the substrate 2 is prevented from being odd-numbered, and the practical scan number of the substrate 2 can be surely even-numbered. As a result, a time loss (for example, about 1 to 1.6 sec. per substrate) due to the moving time for one extra scan in the case where the scan number is odd can be eliminated, and the throughput can be improved.

When an odd scan number is reduced to an even number which is smaller by 1 than the odd scan number, or for example a scan number of 3 is reduced to 2, the scan speed is lowered in order to realize the same dose amount (see Expression 2 and FIGS. 3 and 9), but the implantation time of the substrate 2 is not changed. From this point of view, the throughput is not reduced. This will be described by way of an example. It is assumed that an implantation time which is required for implanting a desired dose amount at a certain beam current is, for example, 3 sec. Even when implantation is performed in three split implantation times of 1 sec., or in two split implantation times of 1.5 sec., the total implantation time is 3 sec. or unchanged.

In the ion implantation method (apparatus) of the embodiment, in the case where the calculated scan time is odd, moreover, an even practical scan number is obtained by a decrement of 1 in place of an increment of 1, and therefore the scan number is reduced by one. As a result, the time loss which mainly consists of deceleration and acceleration times of the substrate 2 in the vicinities of scan ends for the scan return can be reduced by a time corresponding to one scan. Also from this viewpoint, therefore, the throughput can be improved.

Figure 10:
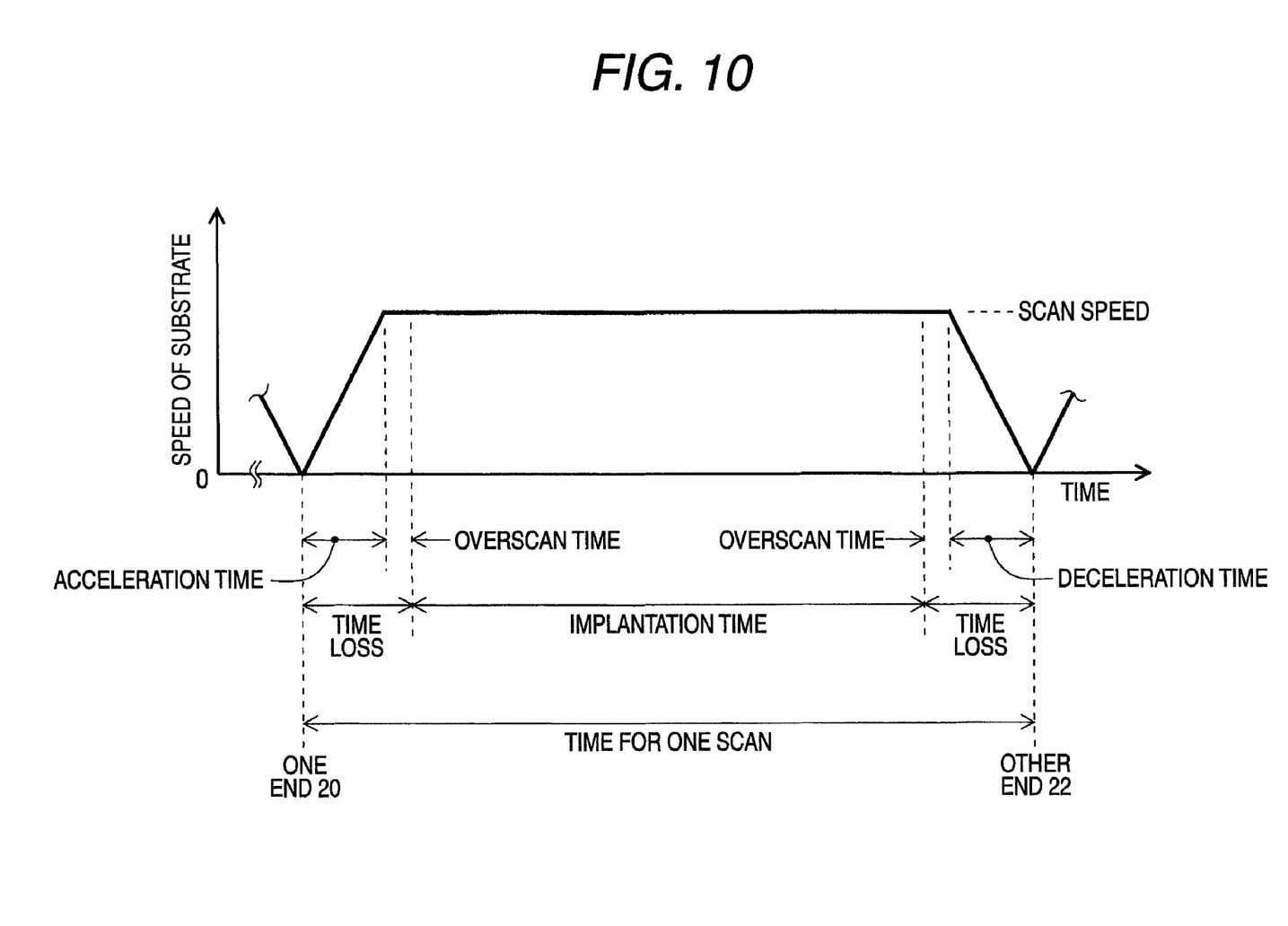
FIG. 10 is a view showing an example of a transition of a speed in one scan of the substrate.

The time loss which mainly consists of deceleration and acceleration times of the substrate 2 in the vicinities of scan ends will be described in detail with reference to FIG. 10. This time loss is a total of wasted times other than the time of implantation into the substrate 2 (this time occurs twice per scan) during the time for one scan. Most of the time loss consists of the deceleration time before the scan return and the acceleration time after the scan return. The time loss is the sum of these deceleration and acceleration times and an overscan time (this time also occurs twice per scan) for the overscan of the substrate 2 (the operation in which the substrate 2 is overscanned in slightly excess so that the substrate 2 is surely located outside the ion beam 4). For example, the time loss is about 0.4 sec. per scan in the case where the reference scan speed is 320 mm/sec., and about 0.5 sec. per scan in the case where the reference scan speed is 200 mm/sec. In the ion implantation method (apparatus) of the embodiment, as described above, the throughput can be improved also with respect to the time loss.

In the specification, the term "scan speed" means the scan speed in the implantation time and the overscan time.

If an increment of 1 is performed in the case where an odd scan number is to be even-numbered, the scan speed must be correspondingly increased (see Expression 2), and the scan speed may exceed the maximum scan speed of the substrate driving device 10 (more specifically, the scanning device 18), thereby causing the possibility that the scan cannot be performed. By contrast, when a decrement of 1 is performed as in the ion implantation method (apparatus) of the embodiment, it is possible to prevent such a disadvantage from occurring. If an increment of 1 is performed, the scan number is increased by 1, and the time loss in the vicinities of scan ends is increased by a degree corresponding to one scan. By contrast, when a decrement of 1 is performed as in the ion implantation method (apparatus) of the embodiment, the time loss can be reduced by a degree corresponding to one scan as described above.

In the case where an odd scan number is to be even-numbered, as described above, a decrement of 1 is more preferable than an increment of 1 because the above-described effect can be attained.

Examples of results of the measurement of the throughput will be briefly described. When a scan number of 3 was even-numbered to that of 2, the throughput was improved by about 10%, and, when a scan number of 0.5 was even-numbered to that of 4, the throughput was improved by about 8%.

Next, an embodiment in which step implantation is performed will be described. In step implantation, ion implantation is performed while, during a period when the ion beam 4 does not impinge on the substrate 2, the substrate 2 is rotated by a step of 360/m deg. about the center portion 2a of the substrate 2 in, for example, the direction of the arrow A (or the opposite direction), and one rotation of the substrate is divided into a plurality (namely, an integer of two or more) m of implanting steps. Namely, m is the implanting step number.

The implantation method is also called step rotation implantation. In the embodiment, the twist motor 14 of the substrate driving device 10 is used for the rotation of the substrate 2.

The scan number n per implanting step is an integer of one or more. Therefore, the total scan number N is expressed by the following expression.

$$N = mn \text{[time]} \qquad \text{[Expression 3]}$$

Figure 4:
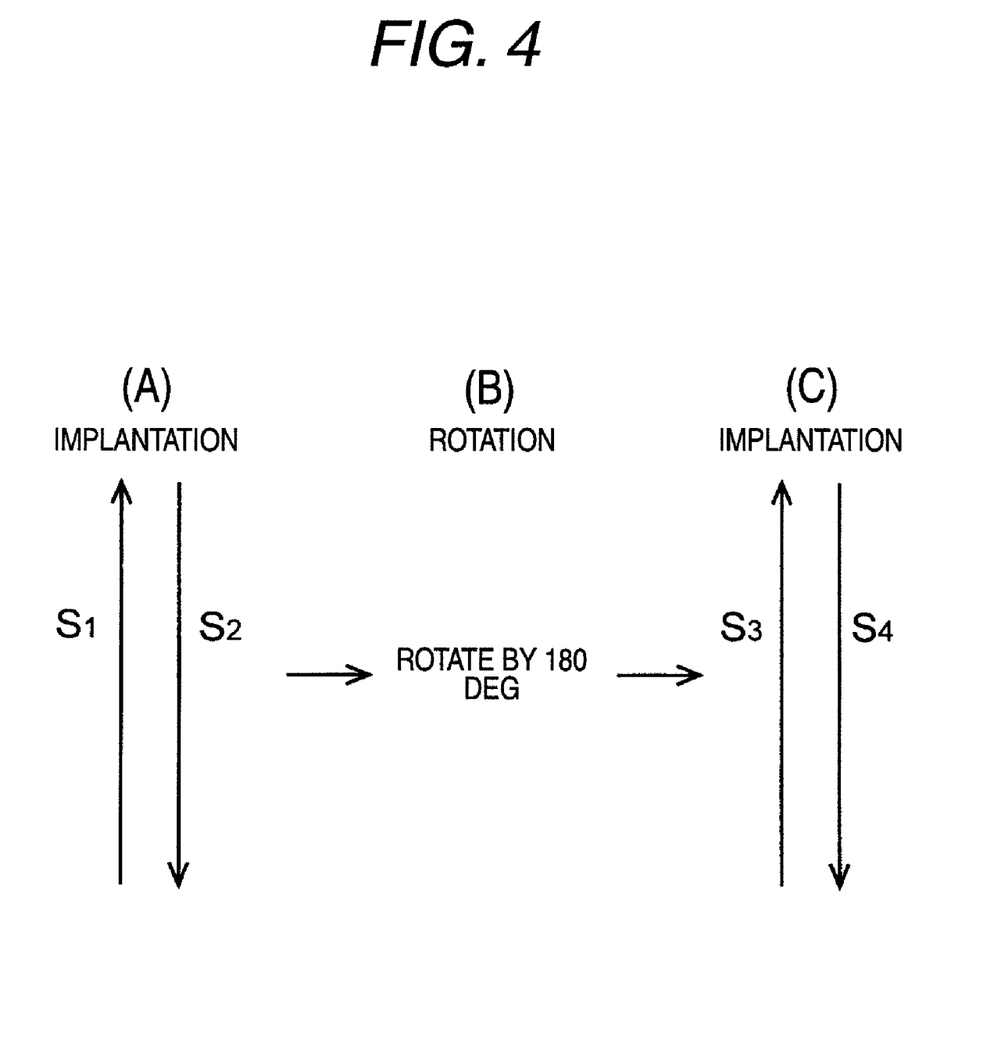
FIG. 4 is a diagram showing an example of step implantation.

FIG. 4 shows an example in the case where the implanting step number m is 2, the scan number n per implanting step is 2, and the total scan number N is 4. In this case, two scans (scans $S_1$ and $S_2$) are performed on the substrate 2 in a first implanting step ((A) of FIG. 4), the substrate 2 is then rotated by 180 (=360/2) deg. ((B) of FIG. 4), and two scans (scans $S_3$ and $S_4$) are then performed on the substrate 2 in a second implanting step ((C) of FIG. 4). In the embodiment, the scans $S_1$ to $S_4$ are performed by using the scanning device 18 of the substrate driving device 10. The detail of this is as described above.

Figure 5:
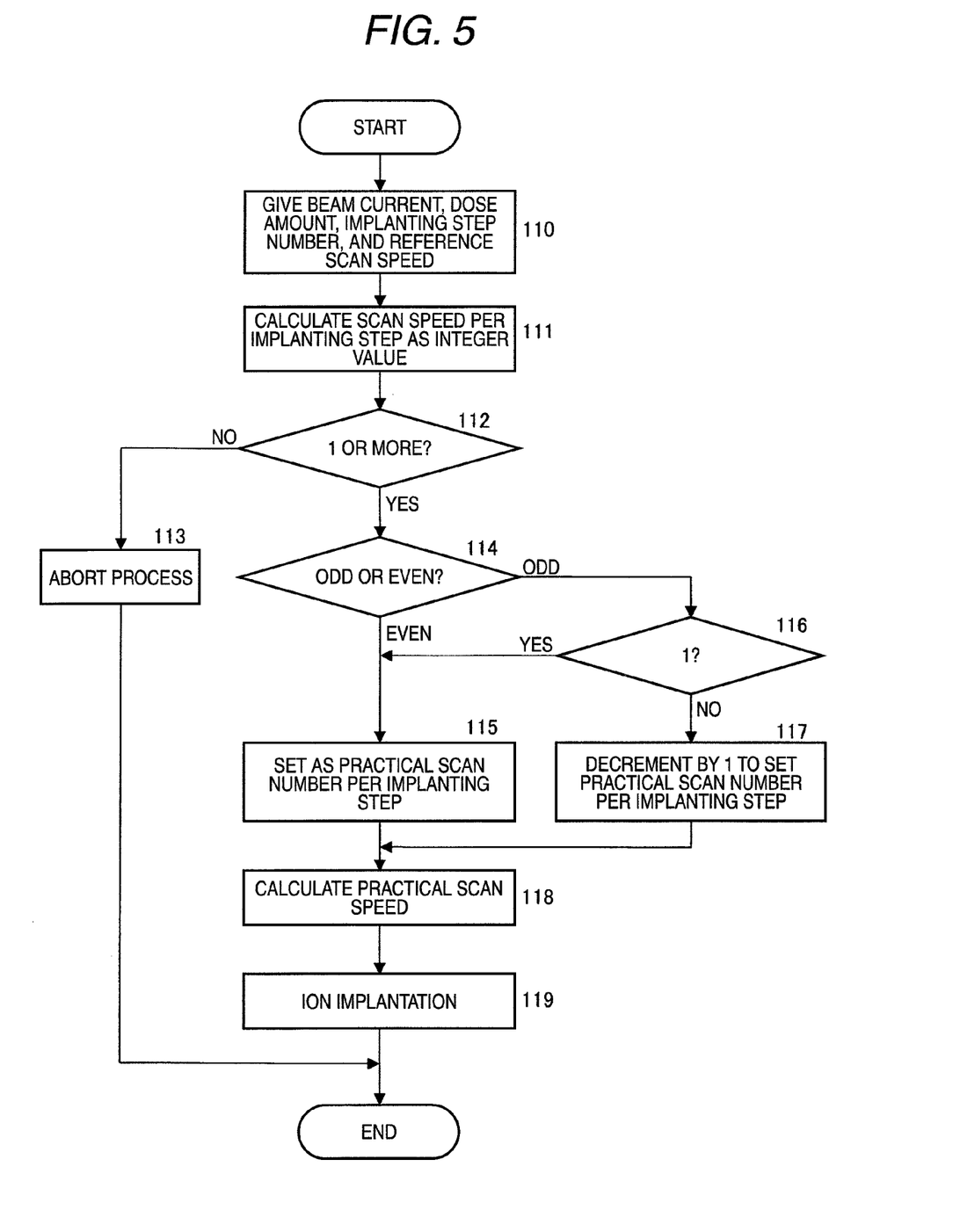
FIG. 5 is a flowchart showing another embodiment of the ion implantation method of the invention.

FIG. 5 shows a flowchart in the case where the step implantation is performed. The flowchart will be described while emphasis is placed on differences from FIG. 2.

In the embodiment, the beam current of the ion beam 4, the dose amount to the substrate 2, the implanting step number, and the reference scan speed are given to the controlling device 30 (step 110). In this case, the reference scan speed is used as a reference for calculating the scan number per implanting step.

The number of scans per implanting step of the substrate 2 which are performed for realizing the dose amount by the substrate driving device 10 (more specifically, the scanning device 18) is calculated by using these values, as an integer value in which digits after a decimal point are truncated (step 111). In accordance with Expression 4 described below or an expression which is mathematically equivalent thereto, more specifically, the scan number per implanting step of the substrate 2 is calculated. In the case where the calculated scan number is a mixed decimal with number of digits after the decimal point, the digits after the decimal point are truncated, or a scan number which is an integer is calculated.

$$\text{scan number per implanting step [time]} = \qquad \text{[Expression 4]}$$

$$\frac{\text{dose amount [ions/cm}^2] \times}{\text{reference scan speed [cm/sec]} \times}$$
$$\frac{\text{elementary electric charge [}C] \times}{\text{coefficient}}$$
$$\frac{\text{coefficient}}{\text{implanting step number} \times}$$
$$\text{beam current} \times 10^{-6} [C/\text{sec}]$$

Next, it is determined whether the scan number which is calculated as an integer value is 1 or more or not (step 112). If the scan number is smaller than 1 (i.e., 0), the process of obtaining a practical scan number per implanting step and a practical scan speed is aborted (step 113) because the scan cannot be performed. In this case, for example, the implantation conditions (the beam current and the dose amount) and the reference scan speed are changed, and the process is again performed with starting from step 110. If the scan number is 1 or more, it is determined whether the scan number is even or not (step 114). If the scan number is even, the current scan number is set as a practical scan number per implanting step (step 115). If the scan number is odd, it is determined whether the scan number is 1 or not (step 116). If the scan number is 1, the current scan number is set as a practical scan number per implanting step because even-numbering cannot be performed by a decrement of 1 (step 115). If the scan number is not 1, an even scan number which is smaller by 1 than the odd scan number is obtained, and the obtained even scan number is set as a practical scan number per implanting step (step 117).

Next, in accordance with Expression 5 described below or an expression which is mathematically equivalent thereto, for example, the practical scan speed of the substrate 2 by the substrate driving device 10 (more specifically, the scanning device 18) is calculated by using the practical scan number per implanting step, the beam current, the dose amount, and the implanting step number (step 118).

$$\text{scan speed [cm/sec]} = \qquad \text{[Expression 5]}$$

$$\frac{\text{implanting step number} \times}{\text{beam current} \times 10^{-6} [C/\text{sec}] \times}$$
$$\frac{\text{scan number per implanting step [time]}}{\text{dose amount [ions/cm}^2] \times}$$
$$\text{elementary electric charge [}C] \times$$
$$\text{coefficient}$$

Then, ion implantation is performed on the substrate 2 in accordance with the practical scan number per implanting step and the practical scan speed (step 119).

In the embodiment, the controlling device 30 has a function of performing the calculation control which has been described with reference to FIG. 5, and a further function of performing a control in which the scan speed is in direct proportion to the beam current as described above during ion implantation into the substrate 2.

In the ion implantation method (apparatus) of the embodiment, in the case of a combination of the case where the practical scan number per implanting step is 1 and that where the implanting step number is odd, the total scan number of the substrate 2 cannot be even-numbered, but, in the case other than the above, the total scan number of the substrate 2 can be even-numbered. Therefore, it is possible to prevent the scan number from being odd-numbered. As a result, a time loss due to the moving time for one extra scan in the case where the scan number is odd can be eliminated, and the throughput can be improved. The detail of this is as described in the embodiment above.

In the case where the calculated scan number per implanting step is an odd number other than 1, an even practical scan number is obtained by a decrement of 1 in place of an increment of 1, and therefore the scan number per implanting step is reduced by one. As a result, the time loss which mainly consists of deceleration and acceleration times of the substrate in the vicinities of scan ends for the scan return can be reduced per implanting step by a time corresponding to one scan. Also from this viewpoint, therefore, the throughput can be improved. The detail of this is as described in the embodiment above.

In the case where an odd scan number per implanting step is to be even-numbered, a decrement of 1 is more preferable than an increment of 1, as described in the embodiment above.

What is claimed is:

1. An ion implantation method of implanting ions into a substrate using both a ribbon-like ion beam in which, with or without performing an X direction sweep, a dimension in an X direction is larger than a dimension in a Y direction that is orthogonal to the X direction, and a mechanical scan of the substrate in a direction intersecting with a principal face of the ion beam, said method comprising:
    calculating a scan number of the substrate as an integer value in which digits after a decimal point are truncated by using a beam current of the ion beam, a dose amount to the substrate, and a reference scan speed which is used as a reference for calculating a scan number of the substrate;
    determining whether the calculated scan number is 2 or more or not; if the scan number is smaller than 2, aborting a process of obtaining a practical scan number and a practical scan speed; if the scan number is equal to or larger than 2, determining whether the calculated scan number is even or odd; if the scan number is even, setting the current scan number as the practical scan number; and, if the scan number is odd, obtaining an even scan number which is smaller by 1 than the odd scan number, and setting the obtained even scan number as the practical scan number;
    calculating the practical scan speed of the substrate by using the practical scan number, the beam current, and the dose amount; and
    performing ion implantation on the substrate in accordance with the practical scan number and the practical scan speed.

2. An ion implantation apparatus for implanting ions into a substrate using both a ribbon-like ion beam in which, with or without performing an X direction sweep, a dimension in an X direction is larger than a dimension in a Y direction that is orthogonal to the X direction, and a mechanical scan of the substrate in a direction intersecting with a principal face of the ion beam, said apparatus comprising:
    a controlling device having functions of: (a) calculating a scan number of the substrate, as an integer value in which digits after a decimal point are truncated by using a beam current of the ion beam, a dose amount to the substrate, and a reference scan speed which is used as a reference for calculating a scan number of the substrate; (b) determining whether the calculated scan number is 2 or more or not; if the scan number is smaller than 2, aborting a process of obtaining a practical scan number and a practical scan speed; if the scan number is equal to or larger than 2, determining whether the calculated scan number is even or odd; if the scan number is even, setting the current scan number as the practical scan number; and, if the scan number is odd, obtaining an even scan number which is smaller by 1 than the odd scan number, and setting the obtained even scan number as the practical scan number; (c) calculating the practical scan speed of the substrate by using the practical scan number, the beam current, and the dose amount; and (d) performing ion implantation on the substrate in accordance with the practical scan number and the practical scan speed.

3. An ion implantation method of implanting ions into a substrate using both a ribbon-like ion beam in which, with or without performing an X direction sweep, a dimension in an X direction is larger than a dimension in a Y direction that is orthogonal to the X direction, a mechanical scan of the substrate in a direction intersecting with a principal face of the ion beam, and performance of ion implantation while, during a period when the ion beam does not impinge on the substrate, rotating the substrate by a step of 360/m deg. about a center portion of the substrate, and dividing one rotation of the substrate into a plurality m of implanting steps, said method comprising:
    calculating a scan number per implanting step of the substrate as an integer value in which digits after a decimal point are truncated by using a beam current of the ion beam, a dose amount to the substrate, a implanting step number, and a reference scan speed which is used as a reference for calculating a scan number per implanting step of the substrate;
    determining whether the calculated scan number per implanting step is 1 or more or not; if the scan number is smaller than 1, aborting a process of obtaining a practical scan number per implanting step and a practical scan speed; if the scan number is equal to or larger than 1, determining whether the calculated scan number per implanting step is even or odd; if the scan number is even, setting the current scan number as the practical scan number per implanting step; if the scan number is odd, determining whether the scan number is 1 or not; if the scan number is 1, setting the current scan number as a practical scan number per implanting step; and, if the scan number is not 1, obtaining an even scan number which is smaller by 1 than the odd scan number, and setting the obtained even scan number is set as the practical scan number per implanting step;
    calculating the practical scan speed of the substrate by using the practical scan number per implanting step, the beam current, the dose amount, and the implanting step number; and performing ion implantation on the substrate in accordance with the practical scan number per implanting step and the practical scan speed.

4. An ion implantation apparatus for implanting ions into a substrate using all of a ribbon-like ion beam in which a dimension in an X direction is larger than a dimension in a Y direction that is orthogonal to the X direction, a mechanical scan of the substrate in a direction intersecting with a principal face of the ion beam, and performance of ion implantation while, during a period when the ion beam does not impinge on the substrate, rotating the substrate by a step of 360/m deg. about a center portion of the substrate, and dividing one rotation of the substrate into a plurality m of implanting steps, said apparatus comprising:

a controlling device having functions of: (a) calculating a scan number per implanting step of the substrate, as an integer value in which digits after a decimal point are truncated by using a beam current of the ion beam, a dose amount to the substrate, a number of the implanting steps, and a reference scan speed which is used as a reference for calculating a scan number per implanting step of the substrate; (b) determining whether the calculated scan number per implanting step is 1 or more or not; if the scan number is smaller than 1, aborting a process of obtaining a practical scan number per implanting step and a practical scan speed; if the scan number is equal to or larger than 1, determining whether the calculated scan number per implanting step is even or odd; if the scan number is even, setting the current scan number, as the practical scan number per implanting step; if the scan number is odd, determining whether the scan number is 1 or not; if the scan number is 1, setting the current scan number, as the practical scan number per implanting step; and, if the scan number is not 1, obtaining an even scan number which is smaller by 1 than the odd scan number, and setting the obtained even scan number as the practical scan number per implanting step; (c) calculating a practical scan speed of the substrate by using the practical scan number per implanting step, the beam current, the dose amount, and the implanting step number; and (d) performing ion implantation on the substrate in accordance with the practical scan number per implanting step and the practical scan speed.

* * * * *